(12) United States Patent
Wei et al.

(10) Patent No.: US 7,192,841 B2
(45) Date of Patent: Mar. 20, 2007

(54) METHOD OF WAFER/SUBSTRATE BONDING

(75) Inventors: Jun Wei, Singapore (SG); Zhiping Wang, Singapore (SG); Hong Xie, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/512,711

(22) PCT Filed: Apr. 30, 2002

(86) PCT No.: PCT/SG02/00072

§ 371 (c)(1), (2), (4) Date: Oct. 27, 2004

(87) PCT Pub. No.: WO03/097552

PCT Pub. Date: Nov. 27, 2003

(65) Prior Publication Data

US 2005/0215028 A1   Sep. 29, 2005

(51) Int. Cl.
*H01L 21/46* (2006.01)
*H01L 21/30* (2006.01)
*H01L 21/76* (2006.01)

(52) U.S. Cl. ............ 438/455; 438/456; 438/457; 438/458; 438/459; 438/406; 257/E21.089

(58) Field of Classification Search ........ 438/455–456, 438/457–459, 406
See application file for complete search history.

(56) References Cited

U.S. PATENT DOCUMENTS

| | | | |
|---|---|---|---|
| 4,883,215 A * | 11/1989 | Goesele et al. ............. 438/455 |
| 5,266,135 A | 11/1993 | Short et al. ................... 156/87 |
| 5,318,652 A | 6/1994 | Hocker et al. ............. 156/273.9 |
| 5,346,848 A | 9/1994 | Grupen-Shemansky et al. .......... 437/61 |
| 5,407,856 A | 4/1995 | Quenzer et al. .............. 437/61 |
| 5,413,955 A | 5/1995 | Lee et al. ..................... 437/86 |
| 5,695,590 A | 12/1997 | Willcox et al. .......... 156/272.2 |
| 5,728,624 A | 3/1998 | Linn et al. .................. 438/459 |
| 5,820,648 A | 10/1998 | Akaike et al. ................. 65/36 |
| 5,843,832 A | 12/1998 | Farmer et al. .............. 438/406 |

(Continued)

FOREIGN PATENT DOCUMENTS

EP   0 441 270   11/1995

(Continued)

OTHER PUBLICATIONS

J.B. Lasky, Wafer bonding for silicon-on-insulator technologies, Applied Physics Letter, 48 (1986) 78.

(Continued)

*Primary Examiner*—Michael Lebentritt
*Assistant Examiner*—Mohsen Ahmadi
(74) *Attorney, Agent, or Firm*—Ostrolenk, Faber, Gerb & Soffen, LLP

(57) ABSTRACT

A method of bonding two components by depositing an amorphous and non-hydrogenated intermediate layer (2) on one of the components (1,4) and arranging the components (1,4) in spaced relationship with the intermediate layer (2) therebetween. The method further comprises heating one or both of the components (1,4) before bringing the components (1,4) into contact. Finally, a voltage is applied to the components (1,4) to create a permanent bond between the two components.

21 Claims, 3 Drawing Sheets

U.S. PATENT DOCUMENTS

| | | | |
|---|---|---|---|
| 5,866,469 | A | 2/1999 | Hays .......................... 438/456 |
| 6,008,113 | A | 12/1999 | Ismail et al. ................ 438/615 |
| 6,159,824 | A | 12/2000 | Henley et al. .............. 438/455 |
| 6,168,678 | B1 | 1/2001 | Plankenhorn et al. ......... 156/64 |
| 6,180,496 | B1 | 1/2001 | Farrens et al. .............. 438/455 |
| 6,548,382 | B1* | 4/2003 | Henley et al. ............... 438/526 |
| 2003/0017679 | A1* | 1/2003 | Lee et al. ................... 438/455 |
| 2003/0040133 | A1* | 2/2003 | Horng et al. ................. 438/22 |
| 2004/0029336 | A1* | 2/2004 | Harpster et al. ............ 438/202 |

FOREIGN PATENT DOCUMENTS

| | | | |
|---|---|---|---|
| EP | 1 130 647 | | 9/2001 |
| EP | 0 664 557 | | 8/2004 |
| JP | 59-174549 | * | 3/1983 |
| JP | 59-174549 | | 10/1984 |
| JP | 61-145839 | | 7/1986 |
| JP | 62-265728 | | 11/1987 |
| JP | 63-111652 | | 5/1988 |
| JP | 63 111652 | | 5/1988 |
| JP | 90-97755 | | 4/1997 |
| JP | 11-219872 | | 8/1999 |
| JP | 2000-121468 | | 4/2000 |
| KR | 9003249 | | 5/1990 |
| WO | WO 01/29890 A2 | | 4/2001 |

OTHER PUBLICATIONS

W.P. Maszara et al., Bonding of silicon wafers for silicon-on-insulator, Journal of Applied Physics, 64 (1998) 4943.

S. Bengtsson et al., Interface charge control of directly bonded silicone structures, Journal of Applied Physics, 66 (1989) 1231.

H. Nakanishi, et al., Studies on $SiO_2$—$SiO_2$ bonding with hydrofluoric acid. Room temperature and low Stress bonding technique for MEMS, Sensors and Actuators, 79 (2000) 237.

Q.Y. Tong, et al., Low Temperature Wafer Direct Bonding, Journal of Microelectromechanical Systems, 3 (1994) 223.

R.F. Wolffenbuttel et al., Low Temperature silicon wafer-to-wafer bonding using gold at eutectic temperatures, Sensors and Actuators, A43 (1994) 223.

S.E. Shoal, et al., Aligned Au-Si eutectic bonding of silicon structure, Journal of Vacuum Science and Technology, A12 (1994) 29.

J.G. Fleming, et al., Low Temperature, High Strength, Wafer-to-Wafer Bonding, Journal of Electrochemical Society, 139 (1992) 3300.

S.A. Audet et al., Integrated Sensor Wafer-Level Packaging, Proceedings of International Conference on Solid State Sensors and Actuators, Chicago, (1997) 287.

A Singh, et al., Batch Transfer of Microstructures using Flip-Chip Solder Bump Bonding, Proceedings of International Conference on Solid State Sensors and Actuators, Chicago, (1997) 265.

F. Niklaus, et al., Low-Temperature full wafer adhesive bonding, Journal of Micromechanics and Microengineering, 11 (2001) 100.

G. Klink, et al., Wafer bonding with an adhesive coating, Proceedings of SPIE, 3514 (1998) 50.

T. Rogers et al., Selection of glass, anodic bonding conditions and material compatibility of silicon-glass capacitive sensors, Sensors and Actuators, A46-47 (1995) 113.

M.M. Viser, et al., Chemical analysis of bonded and debonded silicon-glass interfaces, Journal of Micromechanics and Microengineering, 11 (2001) N1.

A. Berthold, et al., A Novel Technological Process for Glass-to-Glass Anodic Bonding, Sensors and Actuators, 82 (2000) 224.

S. Tatic-Lucic, et al., Bond-quality characterization of silicon-glass anodic bonding, Sensors and Actuators, A60 (1997) 223.

M. Wiegand et al., Wafer bonding of silicone wafers covered with various surface layers, Sensors and Actuators 86 (2000) 91-95.

Thomas M.H. Lee et al., Detailed characterization of anodic bonding process between glass and thin-film coated silicon substrates, Sensors and Actuators 86 (2000) 103-107.

A. Berthold, Glass-to-glass anodic bonding with standard IC technology thin films as intermediate layers, Sensors and Actuators 82 (2000) 224-228.

K. Hiller et al., Low Temperature approaches for fabrication of high frequency microscanners.

M.M. Visser et al., Sodium Distribution in thin-film anodic bonding, Sensors and Actuators A92 (2001) 223-228.

S. Weichel et al., Low-temperature anodic bonding to silicone nitride, Sensors and Actuators 82 (2000) 249-253.

* cited by examiner

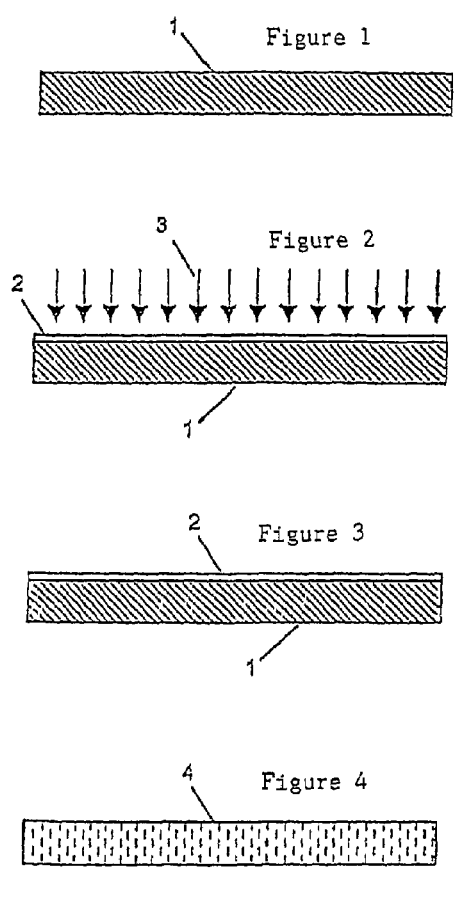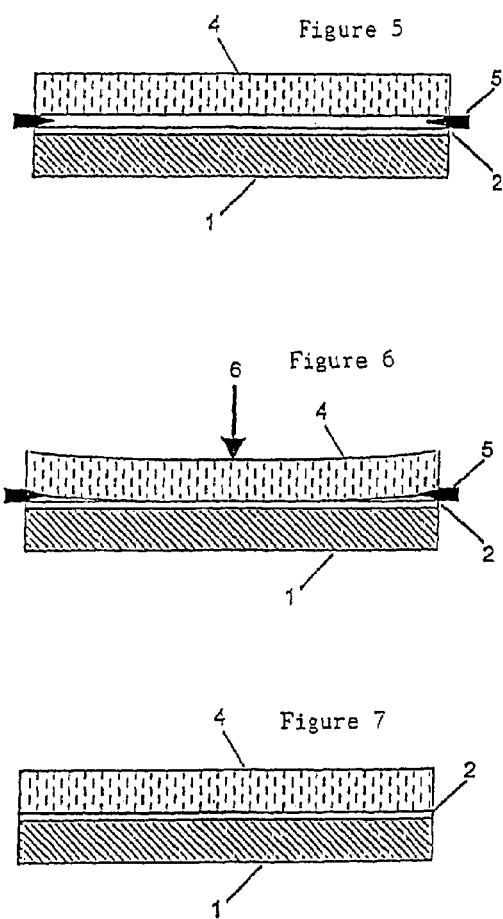

Fracture surface in Silicon — Fracture surface in glass

Fracture surface in Silicon — Fracture surface in glass

METHOD OF WAFER/SUBSTRATE BONDING

CROSS REFERENCE TO RELATED APPLICATION

This is a U.S. National stage of application No. PCT/SG02/00072, filed on 30 Apr. 2002.

BACKGROUND AND FIELD OF THE INVENTION

This invention relates to a method of wafer/substrate bonding, particularly but not exclusively, to a method of anodic bonding.

Wafer/substrate bonding has increasingly become a key technology for materials integration in various areas of microelectromechanical systems (MEMS), microoptoelectromechanical systems (MOEMS), microelectronics, optoelectronics and substrate fabrication. It is also widely used for vacuum packaging, hermetic sealing and encapsulation.

In order to bond the wafers/substrates together, various technologies have already been developed, for example, silicon fusion bonding, anodic bonding and intermediate layer bonding, including eutectic, glass frit, solder and adhesive bonding.

Anodic bonding is widely used for bonding between a glass wafer/substrate and a metal or semiconductor wafer/substrate, such as a silicon wafer. Using the silicon wafer as an example, in a conventional anodic bonding process, the wafers are heated, typically to a temperature between 300° C. and 600° C., which increases the mobility of the positive ions in the glass. Next, a typical voltage of 400 volts to 1200 volts is applied to the glass and the silicon wafer to be bonded, such that the voltage of the silicon wafer is positive with respect to the glass wafer. The positive ions in the glass are attracted to the high negative voltage thus creating a space charge at the glass-silicon interface, which produces a strong electrostatic attraction between the silicon and glass wafers, fixing them firmly in place.

The elevated temperature also causes oxygen from the glass wafer to be transported to the glass-silicon interface where the oxygen combines with the silicon to form silicon oxide, creating an irreversible chemical bond at the glass-silicon interface, when the voltage is subsequently removed.

Therefore, a higher temperature generally yields a better bonding strength. Preferably, a bonding temperature above 400° C. is recommended, which has been demonstrated to achieve a successful bond. However, a high bonding temperature may result in other problems such as a residual stress after the anodic bonding due to the thermal expansion mismatch between the two wafers, and damage of the metal circuits on the silicon wafer after the bonding. In addition, a high temperature may prevent the use of certain metals in the bonding stack as well.

On the other hand, if the bonding temperature is reduced, bonding quality will be affected resulting in a weak or poor bond between the two wafers. In addition, a poor bond is susceptible to the formation of bubbles or cavities in the glass-silicon interface, which are difficult to minimize or eliminate.

There have been proposed methods of bonding between a glass wafer/susbtrate and a silicon wafer/substrate at relatively low bonding temperatures. For example, patent number U.S. Pat. No. 5,695,590 discloses a method of bonding two glass wafers using an intermediate layer of alkaline ion barrier between the two wafers at a temperature between 250° C. and 500° C. However, a problem with this proposed method is that bonding quality is relatively poor at the lower limit of the disclosed temperature range. Patent document U.S. Pat. No. 5,820,648 relates to an anodic process between a silicon and a glass substrate at a temperature of approximatley 200° C. by irradiating a light beam to relax the network structure of glass so as to promote the diffusion of modifier ions in the glass. A disadvantage of this proposed method is that it is difficult to irradiate the entire bonding area of the substrates, especially for wafer level bonding, since the electrode to supply the required voltage may shield the light beam. Moreover, the apparatus to perform this proposed method is expensive to setup.

It is an object of the invention to provide a bonding method which alleviates at least one of the disadvantages of the discussed prior art.

SUMMARY OF THE INVENTION

In a first aspect of the invention, there is provided a method of bonding two components, each component being a wafer or a substrate, the method comprising the steps of:
  i. depositing an amorphous and non-hydrogenated intermediate layer on one of the components;
  ii. arranging the components in spaced relationship with the intermediate layer therebetween;
  iii. heating one or both components;
  iv. bringing the components into contact; and
  v. applying a voltage to the components.

An advantage of the described embodiment of the invention is that the components can be bonded at a relatively low temperature between 300° C. and 200° C. or less, and at the same time ensuring good bonding quality such as high bonding strength and bubble-free interfaces.

A further advantage of the described embodiment of the invention is that each individual process step is simple and easy to apply and compatible with the existing bonding techniques so that the proposed method can be carried out at a low cost.

The term "non-hydrogenated" is used in this application to mean that the intermediate layer is synthesized without using hydrogen or that the deposition process forming the intermediate layer does not deliberately introduce any hydrogen or hydrogen radicals. It should be noted that it is virtually impossible to remove all hydrogen content since hydrogen may be introduced due to contamination, for example during the deposition process.

Typically, the deposition process comprises the use of a target substance for forming the intermediate layer and it should also be apparent that the constituent element that is used to form the amorphous layer using such a process does not contain hydrogen or hydrogen radicals.

Typically, one of the components is an insulator such as glass material, for example borosilicate glass or other suitable glass having alkaline ions.

Preferably, the method further comprises the step of cleaning one of the components using a cleaning solution prior to depositing the intermediate layer on this component. Typically, the method further comprises the step of treating both components with a hydrophilic solution subsequent to the deposition of the intermediate layer on one of the components.

Typically, the hydrophilic solution is sulphuric or hydrogen peroxide solution and the treatment process takes place at an approximate temperature between 50° C. and 80° C.

Preferably, after the cleaning process, the method further comprises the step of flushing the hydrophilic solution from the components. Typically, the flushing process is carried out using deionised water. After the flusing process, the method may further comprise the step of drying the bonding surfaces of the components.

Typically, the components are spaced from each other using spacers with the intermediate layer therebetween. The components may then be placed in a vacuum chamber for the bonding operation with the temperature less than 300° C. A typical voltage, approximately between 100 volts to 1000 volts, may also be applied to the components. Preferably, the two components are bonded anodically.

Preferably, the deposition of the intermediate layer is carried out using physical vapour deposition, for example ion beam deposition, laser ablation or sputtering. A suitable intermediate layer may be selected from the group consisting of silicon, silicon oxide or silicon nitride.

In a second aspect of the invention, there is provided a bonded assembly comprising two components, each component being a wafer or a substrate, and an amorphous and non-hydrogenated intermediate layer.

The invention also relates to a semiconductor device, an electronic device, a microelectromechanical system or a microoptoelectromechanical system having the bonded assembly according to the second aspect of the invention.

BRIEF DESCRIPTION OF THE DRAWINGS

An embodiment of the invention will now be described, by way of example, with reference to the accompanying drawings in which:

FIG. 1 illustrates a first component to be bonded;

FIG. 2 illustrates deposition of an amorphous intermediate layer using physical vapour deposition onto the first component of FIG. 1;

FIG. 3 illustrates the treatment of the component of FIG. 1 in a hydrophilic solution;

FIG. 4 illustrates a second component to be bonded with the first wafer;

FIG. 5 illustrates the alignment of the components of FIGS. 1 and 4, spaced apart using spacers;

FIG. 6 illustrates the components of FIG. 5 being brought into point contact with the spacers being withdrawn;

FIG. 7 illustrates bonding between the components of FIG. 6;

FIG. 9b illustrates a mirror image of the same fracture area of FIG. 9a.

DETAILED DESCRIPTION OF THE PREFERRED EMBODIMENT

Figure 8:
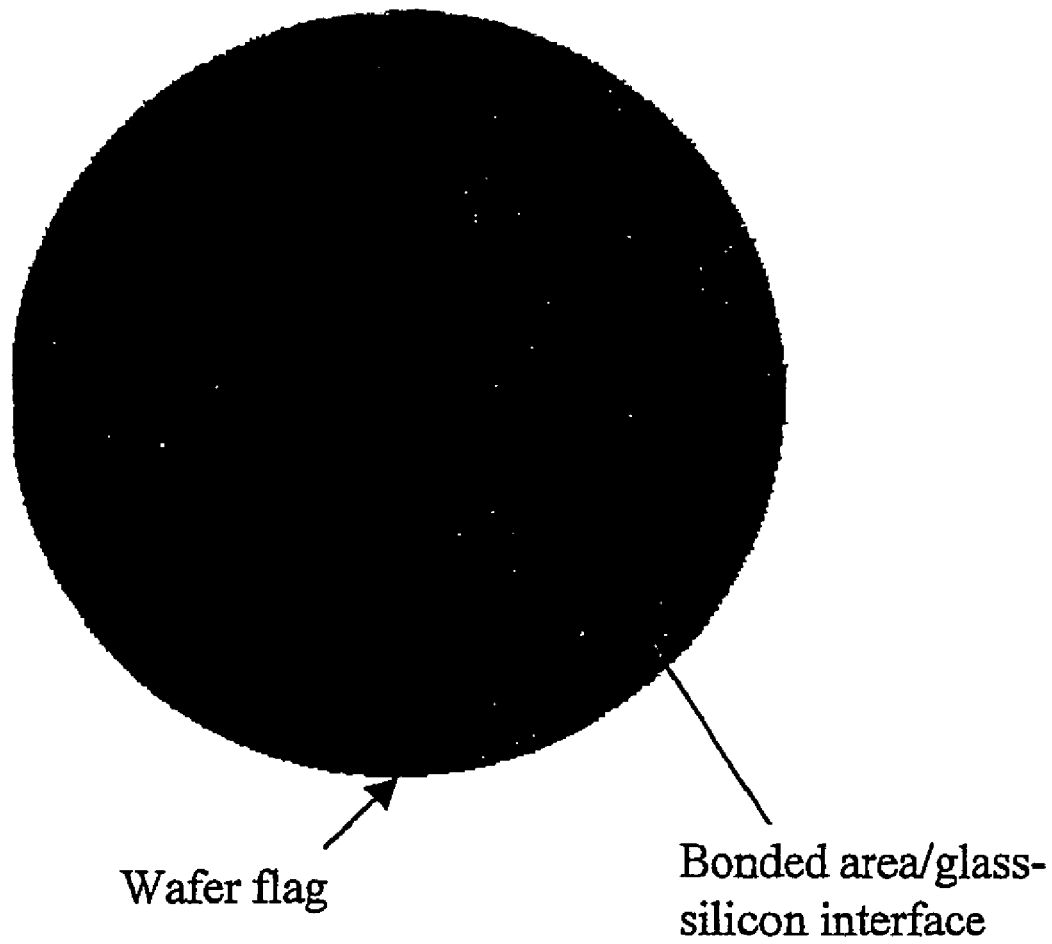
FIG. 8 illustrates a typical C-SAM image of the bonded surface between the components of FIG. 7.

FIG. 1 illustrates a first component in the form of a wafer 1 to be bonded for example, a semiconductor, ceramic, glass, or other materials, whereas FIG. 4 illustrates a second component in the form of a glass wafer 4. A suitable type of glass material is borosilicate glass or other types of glass material having alkaline ions may be used. In this embodiment, Pyrex 7740 glass is used as the glass wafer 4 for the bonding operation.

In this embodiment, silicon will be used as an example for the first wafer 1. The conditioning of the silicon wafer 1 may take the form of polishing the surface for the bonding operation so that the surface is a "mirror-polished surface", which has a surface roughness of typically in the nanometer range. In addition, prior to introduction of the silicon wafer 1 into a deposition chamber, the surface is ultrasonically cleaned by means of a cleansing solvent, for example nitric acid, ammonium hydrogen peroxide, RCA cleansing solution (which can be sulfuric or hydrogen peroxide based) or acetone.

Next, in the deposition chamber, an amorphous intermediate layer 2 is deposited on the "mirror polished" surface of the silicon wafer 1, as shown in FIG. 2. The deposition of the amorphous intermediate layer 2 on the wafer surface creates a high surface energy on the wafer 1 and a "non-closely" stacked atom structure. High surface energy reduces the necessary bonding temperature and a "non-closely" stacked structure permits charge diffusion into a deeper depth so as to improve the bonding strength. Examples of a suitable amorphous intermediate layer 2 are silicon, silicon oxide and silicon nitride.

It is essential that the amorphous intermediate layer 2 is non-hydrogenated, meaning that the intermediate layer is deposited without deliberately using hydrogen or hydrogen radicals during the deposition process. In this way, the intermediate layer formed would be substantially hydrogen free. This is important because hydrogen has a higher affinity with oxygen than most of other elements and thus oxygen (from the glass wafer 4) which is transported to the glass-silicon interface between the two wafers 1,4 will bond readily with hydrogen. Therefore, if there is hydrogen present in the amorphous intermediate layer 2, the chemical bonding strength between oxygen and silicon is reduced resulting in a low bonding quality. To ovecome this problem, the amorphous intermediate layer 2 is deposited using physical vapour deposition (PVD) which reduces or eliminates the hydrogen content in the amorphous layer 2.

Examples of PVD methods include laser ablation, ion beam deposition and sputtering. In this embodiment, sputtering is used to grow an amorphous and non-hydrogenated silicon intermediate layer 2 on the silicon wafer 1 at room temperature in the depostion chamber. It should be apparent that there are no hydrogen gas or gases with hydrogen content being used in the deposition chamber. The silicon intermediate layer 2 is deposited using a DC magnetron sputtering system with a base pressure of $5 \times 10^{-7}$ mbar. A 99.99% high purity silicon planar target was mounted on the sputtering system and argon (Ar) gas was used as a sputtering gas. During sputtering, energised plasma ions strike the silicon planar target and cause atoms from the silicon target to be ejected with enough energy to be deposited onto the silicon wafer 1, as illustrated by arrows-3 in FIG. 2. The total flow rate of the sputtering was 100 sccm (standard cubic centimeter per minute) and the actual pressure was approximately $2 \times 10^3$ mbar. The target current was in the range of 0.4 to 1.4 amperes. By controlling the depostion time, a typical intermediate layer thickness ranging from nanometers to micrometers can be achieved.

After the deposition of the amorphous intermediate layer 2 on the silicon wafer 1, the silicon wafer 1 is further treated by immersing the silicon wafer 1 with the amorphous layer 2 in a hydrophilic solution bath, such as sulfuric-, or hydrogen-peroxide-based RCA solution. This treatement process is carried out at a temperature between 50° C. and 80° C. for about 5 to 10 minutes, so that the silicon wafer 1 becomes hydrophilic. This is depicted in FIG. 3.

Similarly, the glass wafer 4 is conditioned first by polishing the bonding surface and then treated in a same hydrophilic solution bath so that the wafer 4 becomes hydrophilic, as shown in FIG. 4.

Next, both wafers 1,4 (and the amorphous intermediate layer 2 deposited on the silicon wafer 1) are flushed with deionised water to remove the hydrophilic solution from the wafer's surface. This is followed by "spin-drying" the two wafers 1,4 or blowing inert gases on the wafers 1,4 to speed up the drying process. When the wafers 1,4 are dried, the glass wafer 4 is stacked or arranged in spaced relationship with the intermediate layer 2 and the silicon wafer 1, as shown in FIG. 5. The alignment is of a high accuracy, typically better than 1 micron. In order to avoid wafer contact during vacuumizing, the two wafers 1,4 are separated by spacers 5, having thickness of typically 20–50 microns, which are introduced at the wafer's edges.

After the alignment, the stacked wafers 1,4 are placed in a vacuum chamber. During vacuumizing, one or both of the wafers 1,4 are heated to a temperature between 300° C. and 200° C. or less. When the temperature reaches the predetermined setting, the two wafers 1,4 are first brought into point contact under pressure in the central area, as shown by arrow 6 in FIG. 6. Next, the spacers 5 are pulled out to allow the rest of the surface between the glass wafer 4 to be in contact with the amorphous intermediate layer 2. Next, anodic bonding of both wafers 1,4 is carried out by applying a voltage ranging between 100 to 1000 volts on the two wafers 1,4 such that the voltage applied on the silicon wafer 1 is positive with respect to the voltage of the glass wafer 4. FIG. 7 illustrates the successful bonding of the two wafers 1,4 at a temperature between 300° C. and 200° C. or less and a voltage of 100 volts to 1000 volts.

After bonding, the bonded assembly of wafers 1,4 are checked with a scanning acoustic microscope (SAM) using a resolution of approximately 2.5 microns. FIG. 8 shows a C-SAM image of the whole bonded surface of a typical bonded wafer 1,4 assembly. As shown, a bubble free glass-silicon interface could be achieved. In some test samples, occasionally, small bubbles were found in the interface, but the unbonded area due to these bubbles was limited to less than 1% of the whole wafer. A laser profilometer was also used to check the warpage and residual stress but there was no warpage and residual stress detected.

The bond created in this manner is distinguished both by a high mechanical strength and long mechanical and chemical durability. The measurements in "pull" tests have shown that the bonding strength can be higher than the fracture strength of glass. The results from the pull tests revealed that bonding strength higher than 20 MPa can be achieved for the bonding temperatures between 200° C. and 300° C. used in the preferred embodiment. It is also found that fracture, if any, would occur inside the glass, or in some cases the silicon, rather than in the glass-silicon interface, as shown in FIGS. 9a and 9b.

Figure 9A:
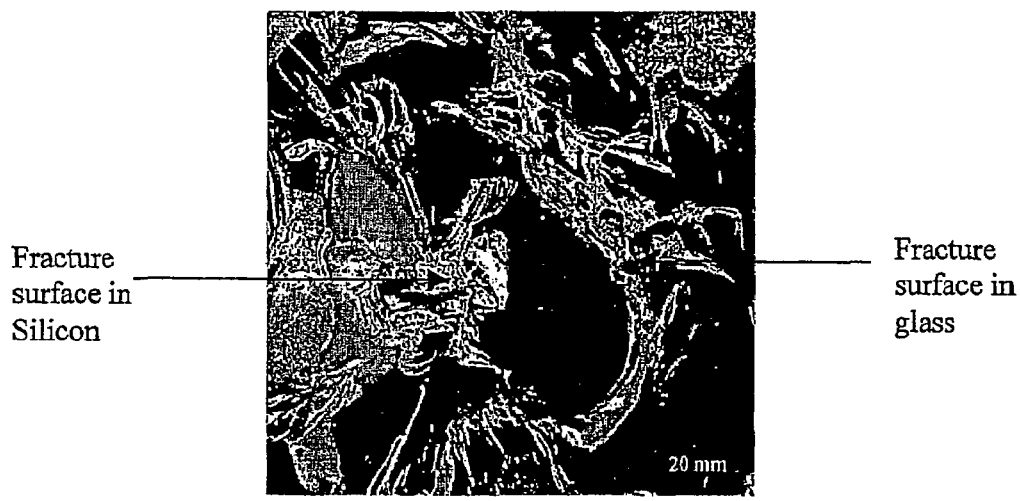
FIG. 9a is an optical image of a fracture area within the bonded components.
Figure 9B:
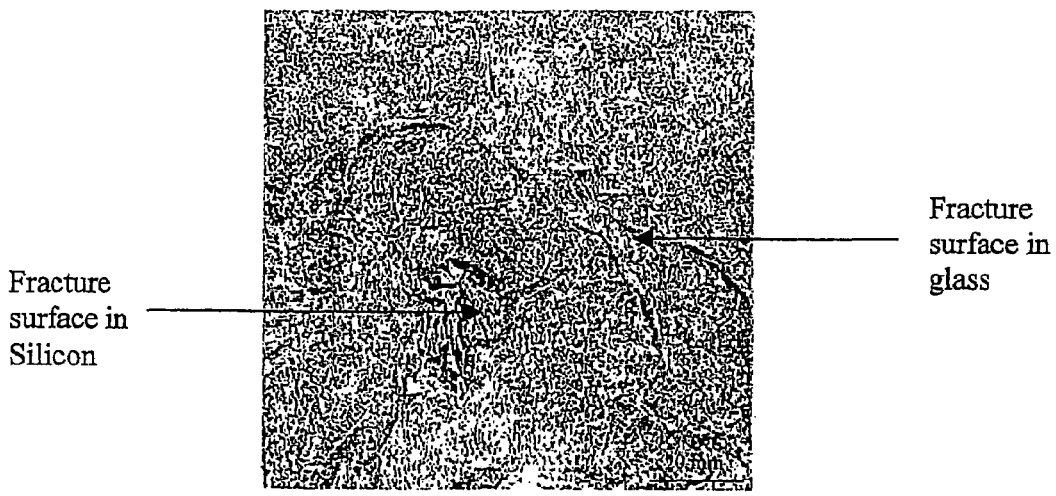

FIG. 9a shows a fractured surface of a bonded wafer 1,4 after dicing to 10×10 mm and FIG. 9b is a mirror image of FIG. 9a illustrating the corresponding fractured surface in the other portion of the bonded wafer 1,4. Both optical images show that the fracture happens in the glass or in the silicon, and not in the glass-silicon interface.

This high bonding strength thus permits further trouble-free processing of the wafer plates for the fabrication of, for example highly complex microstructures or devices, or the like. It also permits trouble-free post processing of the wafers, such as grinding, polishing, dicing etc.

The reliable bonding at such low temperature in this invention can minimise degradation or damage of pre-fabricated devices and integrated circuitry. It can minimize or eliminate bonding-induced residual stress or warpage after cooling which may cause reliability issues. It can also be used for hermetic and vacuum sealing at a low temperature.

The embodiment described is not to be construed as limitative. For example, although the embodiment describes the bonding between a silicon wafer 1 and a glass wafer 4, other types of wafer or substrate, such as metal, ceramic or semiconductor material, can be used.

The described method is also applicable for bonding between a substrate and a wafer and not just between two wafers. The method may also be used for bonding two substrates or for bonding between a plurality of substrates and/or wafers. For example, after a bonded assembly is formed by using the described method, the bonded assembly can be further bonded using the described method with another component which can be a wafer or a substrate and subsequently, the bonded assembly can again be bonded with a further component. In this way, a multilayer wafer or substrate assembly is formed.

The preferred bonding temperature is between 300° C. and 200° C. to alleviate any residual stress to the glass and silicon wafer 1,4. However, it should be apparent that a bonding temperature higher than 300° C. may be applied to the wafers 1,4 to achieve a better bond if both wafers can withstand the thermal mismatch, when both wafers 1,4 are subsequently cooled to room temperature, or other degradations.

The described embodiment uses sputtering as the PVD process for the deposition of the intermediate layer 2. However, other PVD processes such as ion beam deposition and laser ablation can also be used. In the alternative, other suitable deposition methods, such as chemical vapour deposition (CVD) can also be used as long as the amorphous intermediate layer 2 formed is non-hydrogenated.

The sputtering process described uses a silicon planar target to deposit the silicon intermediate layer 2. In the alternative, other suitable planar targets can be used as long as the substance forming the target does not have hydrogen as a constituent element.

Having now fully described the invention, it will be apparent to one of ordinary skill in the art that many changes and modifications can be made thereto without departing from the scope of the invention as claimed.

The invention claimed is:

1. A method of bonding two components, each component being a wafer or a substrate, the method comprising the steps of:
   i. depositing an amorphous and non-hydrogenated intermediate layer on one of the components using physical vapor deposition;
   ii. arranging the components in spaced relationship with the intermediate layer therebetween;
   ii. heating one or both components;
   iv. bringing the components into contact; and
   v. applying a voltage to the components.

2. A method according to claim 1, wherein one of the components is glass material.

3. A method according to claim 2, wherein the glass material is borosilicate glass or other types of glass having alkaline ion.

4. A method according to claim 1, further comprising the step of cleaning one of the components using a cleaning solution prior to depositing the intermediate layer on said component.

5. A method according to claim 4, wherein the cleaning solution is acetone.

6. A method according to claim 1, further comprising the step of treating the components with a hydophilic solution subsequent to the deposition of the intermediate layer on one of the components.

7. A method according to claim 6, wherein the hydrophilic solution is sulphuric or hydrogen peroxide solution.

8. A method according to claim 6, wherein the treatment using the hydrophilic solution takes place at an approximate temperature between 50° C. and 80° C.

9. A method according to claim 6, wherein after the treatment process, the method further comprises the step of flushing the hydrophilic solution from the components.

10. A method according to claim 9, wherein the flushing process is carried out using deionised water.

11. A method according to claim 9, further comprising the step of drying the bonding surfaces of the components.

12. A method according to claim 1, wherein the components are spaced from each other using spacers.

13. A method according to claim 1, wherein the components are bonded in a vacuum chamber.

14. A method according to claim 1, wherein one or both components are heated to a temperature less than 300° C.

15. A method according to claim 14, wherein the temperature is in the range 200° C. and 300° C.

16. A method according to claim 1, wherein the intermediate layer is selected from the group consisting of silicon, silicon oxide or silicon nitride.

17. A method according to claim 1, wherein the voltage is in the range 100 volts to 1000 volts.

18. A method according to claim 1, wherein the two components are bonded anodically.

19. A method according to claim 1, wherein one component is a wafer.

20. A method of bonding two components, each component being a wafer or a substrate, the method comprising the steps of:
   i. depositing an amorphous and non-hydrogenated intermediate layer on one of the components;
   ii. arranging the components in spaced relationship with the intermediate layer therebetween;
   iii. heating one or both components;
   iv. bringing the components into contact; and
   v. applying a voltage to the components, the steps being performed in the stated order, and wherein step (i) is carried out with the said one of the components being at ambient temperature.

21. A method of bonding two components, each component being a wafer or a substrate, the method comprising the steps of:
   i. depositing an amorphous and non-hydrogenated intermediate layer on one of the components using physical vapour deposition;
   ii. arranging the components in spaced relationship with the intermediate layer therebetween;
   iii. heating one or both components;
   iv. bringing the components into contact; and
   v. applying a voltage to the components, the steps being performed in the stated order and wherein step (i) is carried out with the said one of the components being at ambient temperature.

* * * * *